United States Patent
Chilese et al.

(10) Patent No.: US 11,566,887 B1
(45) Date of Patent: Jan. 31, 2023

(54) DIFFERENTIAL HEIGHT MEASUREMENT USING INTERSTITIAL MIRROR PLATE

(71) Applicant: KLA Corporation, Milpitas, CA (US)

(72) Inventors: Frank Chilese, San Ramon, CA (US); Guido Deboer, GD Gorinchem (NL)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/502,289

(22) Filed: Oct. 15, 2021

Related U.S. Application Data

(60) Provisional application No. 63/240,568, filed on Sep. 3, 2021.

(51) Int. Cl.
| | |
|---|---|
| G01B 9/02 | (2022.01) |
| G01B 11/02 | (2006.01) |
| G03B 17/56 | (2021.01) |
| G03B 17/48 | (2021.01) |
| G01B 9/02015 | (2022.01) |

(52) U.S. Cl.
CPC ........ G01B 11/026 (2013.01); G01B 9/02015 (2013.01); G01B 9/02027 (2013.01); G01B 9/02041 (2013.01); G01B 9/02049 (2013.01); G03B 17/48 (2013.01); G03B 17/561 (2013.01)

(58) Field of Classification Search
CPC .............. G01B 11/026; G01B 9/02015; G01B 9/02027; G01B 9/02041; G01B 9/02049; G03B 17/48; G03B 17/561
See application file for complete search history.

(56) References Cited

U.S. PATENT DOCUMENTS

| | | | |
|---|---|---|---|
| 2002/0008877 A1* | 1/2002 | Iwamoto | G03F 7/70691 356/900 |
| 2006/0187464 A1* | 8/2006 | Womack | G03F 7/70775 356/500 |
| 2008/0304064 A1 | 12/2008 | Kurosawa | |

(Continued)

FOREIGN PATENT DOCUMENTS

WO    2004023069 A1    3/2004

OTHER PUBLICATIONS

WIPO, International Search Report for International Application No. PCT/US2022/041787, dated Dec. 14, 2022.

(Continued)

*Primary Examiner* — Jonathan M Hansen
(74) *Attorney, Agent, or Firm* — Hodgson Russ LLP

(57) ABSTRACT

An apparatus and method are provided. The apparatus includes an imaging device; a stage movable relative to the imaging device; an isolation plate provided between the imaging device and the stage, including a horizontal glass plate; and a plurality of interferometers in electronic communication with a processor. The plurality of interferometers include three interferometers disposed on the imaging device, configured to direct a first beam set in a first direction toward the horizontal glass plate; and three interferometers disposed on the stage, configured to direct a second beam set in a second direction toward the horizontal glass plate, the second direction being opposite to the first direction. The processor is configured to measure distances between the imaging device and the isolation plate and distances between the stage and the isolation plate based on the first beam set and the second beam set reflected from the horizontal glass plate.

20 Claims, 6 Drawing Sheets

(56) References Cited

U.S. PATENT DOCUMENTS

| | | |
|---|---|---|
| 2009/0268021 A1 | 10/2009 | Kawaragi |
| 2013/0342827 A1 | 12/2013 | Ummethala et al. |
| 2018/0224757 A1* | 8/2018 | Van Der Pasch ... G03F 7/70775 |
| 2020/0409274 A1 | 12/2020 | Adriaens et al. |

OTHER PUBLICATIONS

WIPO, Written Opinion of the International Searching Authority for International Application No. PCT/US2022/041787, dated Dec. 14, 2022.

* cited by examiner

DIFFERENTIAL HEIGHT MEASUREMENT USING INTERSTITIAL MIRROR PLATE

CROSS REFERENCE TO RELATED APPLICATION

This disclosure is based on, and claims priority to, U.S. Provisional Application No. 63/240,568, filed on Sep. 3, 2021, the entire disclosure of which is incorporated by reference herein.

FIELD OF THE DISCLOSURE

This disclosure relates to measurement systems and, more particularly, to a measurement system for an inspection system.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer that are separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

Certain inspection processes are performed using an imaging mirror assembly (IMA) directed at a target on a stage. The IMA is mounted to a passive vibration isolator assembly due to its high sensitivity to vibration. This causes the position of the IMA to be variable during the inspection process. However, it is important for the system to determine the position of the IMA relative to the stage for accurate inspection. Existing systems rely on measurements from six interferometers (corresponding to six degrees of freedom), which are mounted to the IMA and/or to the stage or mounted to a separate fixed location in the system. Beams from the interferometers must bounce off large horizontal mirrors fixed to the IMA and/or the stage, which may reduce the performance of the system.

The IMA must be contained in a vacuum region isolated from the vacuum region of the stage. Thus, an isolation plate is provided between the IMA and the stage. However, in order to accommodate interferometer measurements, 45-degree mirrors must be provided to change the horizontal direction of the beams to vertical in order to pass through the isolation plate. These vertical beams must pass through holes or windows of the isolation plate, thereby compromising its performance. Such a solution increases system complexity, and adds a degree of error to the measurements from signal loss.

Therefore, what is needed is system for accurate measurement of the distance between the IMA and the stage that is simple and provides high accuracy and with fewer penetrations in the isolation plate compared to existing methods.

BRIEF SUMMARY OF THE DISCLOSURE

An embodiment of the present disclosure provides an apparatus. The apparatus may comprise an imaging device configured to receive a light beam from a target reticle. The apparatus may further comprise a stage movable relative to the imaging device. The stage may be configured to hold the target reticle. The apparatus may further comprise an isolation plate provided between the imaging device and the stage. The isolation plate may comprise a horizontal glass plate. The apparatus may further comprise a plurality of interferometers in electronic communication with a processor. The plurality of interferometers may comprise three interferometers disposed on the imaging device, configured to direct a first beam set in a first direction toward three locations on the horizontal glass plate. The plurality of interferometers may further comprise three interferometers disposed on the stage, configured to direct a second beam set in a second direction toward the three locations on the horizontal glass plate, the second direction being opposite to the first direction. The processor may be configured to measure distances between the imaging device and the isolation plate and distances between the stage and the isolation plate at each of the three locations on the horizontal glass plate based on the first beam set and the second beam set reflected from the horizontal glass plate.

According to an embodiment of the present disclosure, the first direction may be down, and the second direction may be up.

According to an embodiment of the present disclosure, a reflective coating layer may be provided on a first side of the horizontal glass plate, such that the first beam set and the second beam set reflect off the reflective coating layer. An anti-reflective coating layer may be provided on a second side of the horizontal glass plate, the second side being opposite to the first side, such that one set of the first beam set and the second beam set passes through the anti-reflective coating layer.

According to an embodiment of the present disclosure, the imaging device and the stage may be provided in separate vacuum regions, separated by the isolation plate.

According to an embodiment of the present disclosure, the imaging device may be disposed on a passive vibration isolator.

According to an embodiment of the present disclosure, the first beam set and the second beam set may be uninterrupted between each interferometer and the horizontal glass plate.

According to an embodiment of the present disclosure, sums of the distances between the imaging device and the isolation plate and the distances between the stage and the isolation plate at each of the three locations may be compared to preset sums to determine relative movement between the imaging device and the stage between $t_1$ and $t_2$, wherein $t_2$ is present time and $t_1$ is a time before $t_2$. The relative movement may correspond to movement in one of six degrees of freedom, comprising: surge, heave, sway, roll, pitch, and yaw. The preset sums may correspond to sums of the distances between the imaging device and the isolation plate and the distances between the stage and the isolation plate at each of the three locations measured at $t_1$.

Another embodiment of the present disclosure provides a method. The method may comprise providing an imaging device configured to receive a light beam from a target reticle. The method may further comprise providing a stage movable relative to the imaging device. The stage may be configured to hold the target reticle. The method may further comprise providing an isolation plate between the imaging device and the stage. The isolation plate may comprise a horizontal glass plate. The method may further comprise providing a plurality of interferometers in electronic communication with a processor. The plurality of interferometers may comprise three interferometers disposed on the imaging device, configured to direct a first beam set in a first direction toward three locations on the horizontal glass plate. The plurality of interferometers may further comprise three interferometers disposed on the stage, configured to direct a second beam set in a second direction toward the three locations on horizontal glass plate, the second direction being opposite to the first direction. The method may further comprise directing the first beam set and the second beam set toward the horizontal glass plate. The method may further comprise measuring, using the processor, distances between the imaging device and the isolation plate and distances between the stage and the isolation plate at each of the three locations on the horizontal glass plate based on the beams reflected from the horizontal glass plate.

According to an embodiment of the present disclosure, the method may further comprise comparing, using the processor, sums of the distances between the imaging device and the isolation plate and the distances between the stage and the isolation plate at each of the three locations to preset sums. The method may further comprise determining, using the processor, relative movement between the imaging device and the stage between $t_1$ and $t_2$, wherein $t_2$ is present time and $t_1$ is a time before $t_2$. The relative movement may correspond to movement in one of six degrees of freedom, comprising: surge, heave, sway, roll, pitch, and yaw. The preset sums may correspond to sums of the distances between the imaging device and the isolation plate and the distances between the stage and the isolation plate at each of the three locations measured at $t_1$.

According to an embodiment of the present disclosure, a non-transitory computer-readable storage medium may be configured to perform one or more steps of the method.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Figure 1:
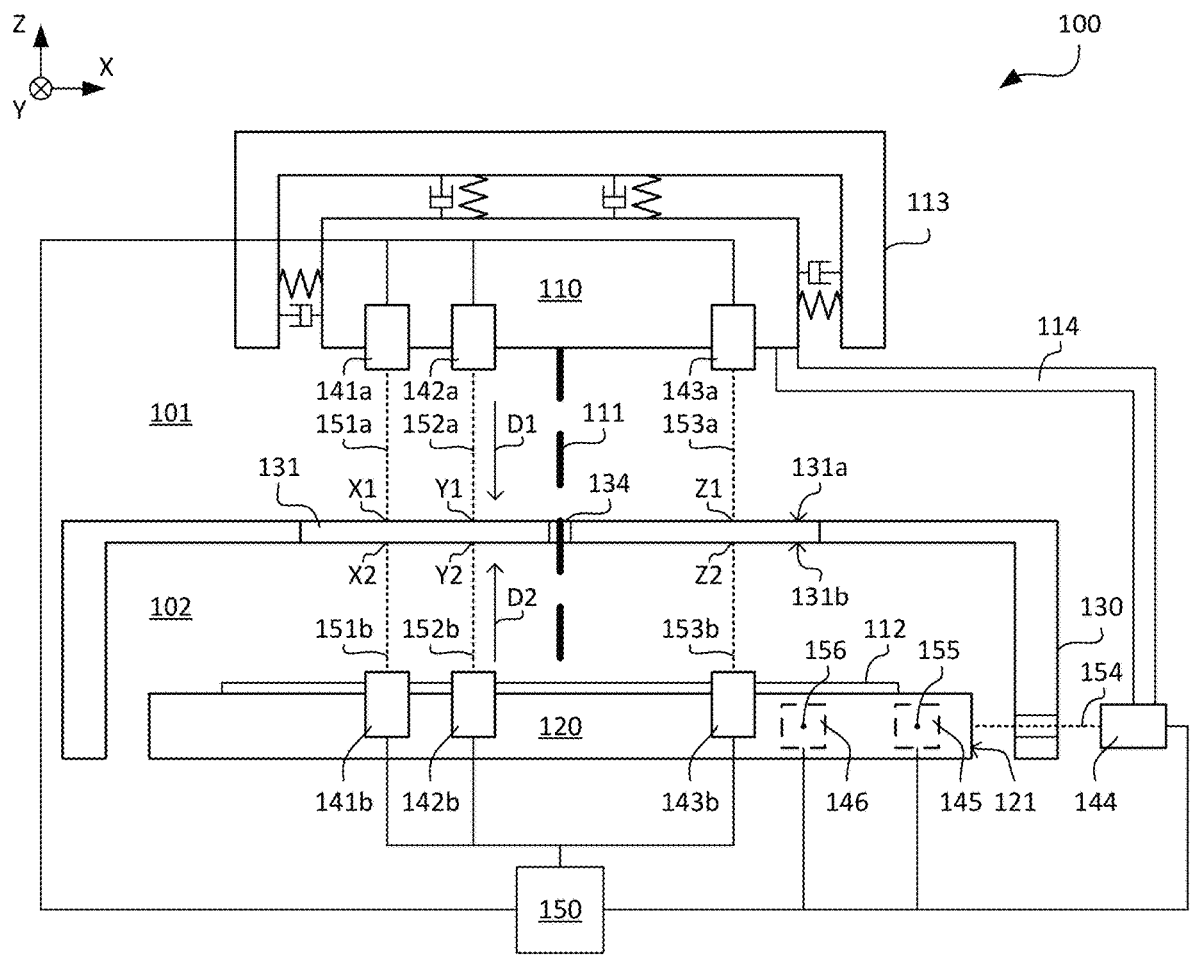
FIG. 1 is a block diagram of an apparatus according to an embodiment of the present disclosure.

An embodiment of the present disclosure, shown in FIG. 1, provides an apparatus 100. The apparatus 100 may comprise an imaging device 110. The imaging device 110 may be configured to receive an EUV light beam 111 (e.g., 13 nm wavelength) from a target reticle 112. The light beam 111 may be configured to perform inspection of the target reticle 112. The target reticle 112 may be a wafer, a workpiece, or any other object to be inspected by the imaging device 110. The imaging device 110 may be disposed on a passive vibration isolator 113. The passive vibration isolator 113 may be comprised of a spring/damper system configured to absorb movement in horizontal and vertical directions. For example, the passive vibration isolator 113 may include elastomers enclosed in vacuum bellows.

The apparatus 100 may further comprise a stage 120. The stage 120 may be movable relative to the imaging device 110. For example, the stage 120 may move relative to the imaging device 110 to perform various inspection processes on the target reticle 112, e.g. swathing, step-and-settle, hotspot, etc. The stage 120 may be configured to hold the target reticle 112.

The apparatus 110 may further comprise an isolation plate 130. The isolation plate 130 may be provided between the imaging device 110 and the stage 120. For example, the imaging device 110 and the stage 120 may be provided in separate vacuum regions 101, 102. The stage vacuum region 102 may be hundreds of times dirtier than the imaging vacuum region 101 (from both a chemical and particle perspective), due to the stage 120 needing to move large distances and carry large loads. Thus, it may be desirable to prevent contamination of the sensitive optics in the imaging vacuum region 101. The isolation plate 130 may separate the vacuum regions 101, 102, and thereby separate the imaging device 110 and the stage 120. The isolation plate 130 may be comprised of sheet metal. The isolation plate 130 may comprise a horizontal glass plate 131. The horizontal glass plate 131 may be comprised of fused silica or any other mechanically stable glass that is transmissive to optical beams. Other types of glass, such as sapphire or Ultra Low Expansion (ULE) silicate, may be used. The horizontal glass plate 131 may be about 6 mm thick. The horizontal glass plate 131 may include an aperture 134, through which the light beam passes. The aperture 134 may be about 6 mm in diameter.

The apparatus 100 may further comprise a plurality of interferometers 140. The plurality of interferometers 140 may be fiber-optic-based interferometers. The plurality of interferometers may be in electronic communication with a processor 150. The processor 150 may be coupled to the plurality of interferometers 140 via the imaging device 110 and the stage 120. The processor 150 may comprise a programmable processor, which is programmed in software and/or firmware to carry out the functions that are described herein, along with suitable digital and/or analog interfaces for connection to the other elements of apparatus 100. Alternatively or additionally, processor 150 may comprise hard-wired and/or programmable hardware logic circuits, which carry out at least some of the functions of the processor 150. Although processor 150 is shown in FIG. 1, for the sake of simplicity, as a single, monolithic functional block, in practice the processor 150 may comprise multiple, interconnected control units, with suitable interfaces for receiving and outputting the signals that are illustrated in the figures and are described in the text. Program code or instructions for the processor 150 to implement various methods and functions disclosed herein may be stored in readable storage media, such as a memory in the processor 150 or other memory. Typically, this piece of electronics would be mounted outside the vacuum chambers (to make it more robust, cheaper, and easier to service).

The plurality of interferometers 140 may comprise three interferometers 141a, 142a, 143a disposed on the imaging device 110. Interferometers 141a, 142a, 143a may be configured to direct a first beam set 151a, 152a, 153a in a first direction D1 toward three locations X1, Y1, Z1, on a first side 131a of the horizontal glass plate 131. For example, a first interferometer 141a may be configured to direct a first beam 151a of the first beam set toward a first location X1 on the horizontal glass plate 131; a second interferometer 142a may be configured to direct a second beam 152a of the first beam set toward a second location Y1 on the horizontal glass plate 131; and a third interferometer 143a may be configured to direct a third beam 153a of the first beam set toward a third location Z1 on the horizontal glass plate 131.

The plurality of interferometers 140 may further comprise three interferometers 141b, 142b, 143b, disposed on the stage 120. Interferometers 141b, 142b, 143b may be configured to direct a second beam set 151b, 152b, 153b in a second direction D2 toward three locations X2, Y2, Z2 on a second side 131b of the horizontal glass plate 131. For example, a first interferometer 141b may be configured to direct a first beam 151b of the second beam set toward a first location X2 on the horizontal glass plate 131; a second interferometer 142b may be configured to direct a second beam 152b of the second beam set toward a second location Y2 on the horizontal glass plate 131; and a third interferometer 143b may be configured to direct a third beam 153b of the second beam set toward a third location Z2 on the horizontal glass plate 131. The second direction D2 may be opposite to the first direction D1. For example, the first direction D1 may be down, and the second direction D2 may be up.

Figure 2A:
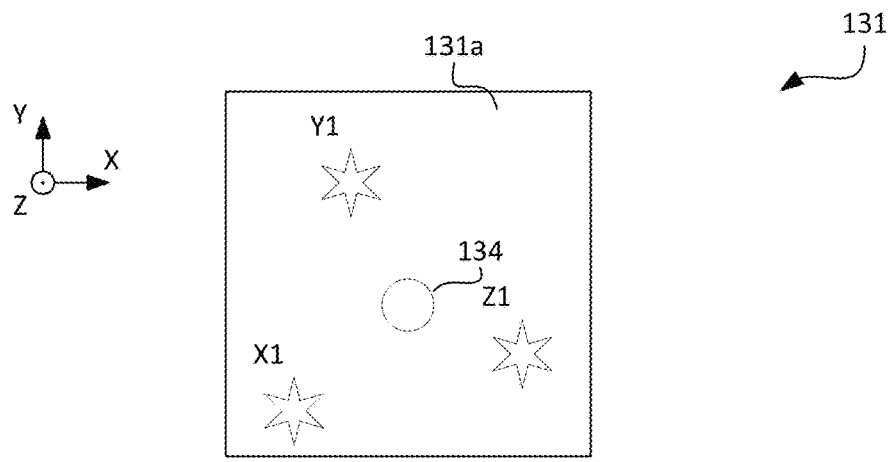
FIG. 2A illustrates a first side of a horizontal glass plate of an embodiment of the present disclosure.
Figure 2B:
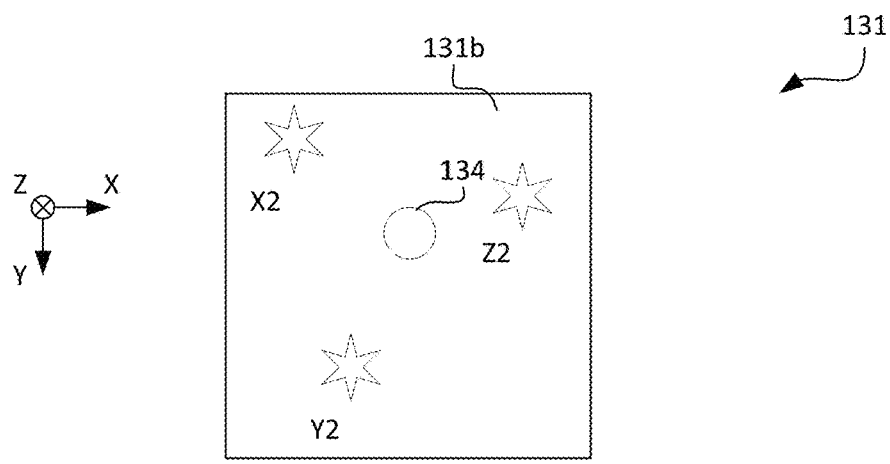
FIG. 2B illustrates a second side of a horizontal glass plate of an embodiment of the present disclosure.

The three locations X1, Y1, Z1 on the first side 131a of the horizontal glass plate 131 (shown in FIG. 2A) may be aligned with the three locations X2, Y2, Z2 on the second side 131b of the horizontal glass plate 131 (shown in FIG. 2B). In this way, the first beam set 151a, 152a, 153a, may be aligned with the second beam set 151b, 152b, 153b on opposite sides of the horizontal glass plate 131, and relative to three shared locations X, Y, Z. The three shared locations X, Y, Z may be any three non-collinear points on the horizontal glass plate 131. For example, the three shared locations X, Y, Z may be in a triangular arrangement. The three shared locations X, Y, Z may surround the light beam 111 or may be arranged on one side of the light beam 111. The three shared locations X, Y, Z, may surround the aperture 134. According to an embodiment of the present disclosure, the three shared locations X, Y, Z may be farther away from light beam 111 than the edge of the target reticle 112. For example, the target reticle may be about 6 inches square, and each of the three shared locations X, Y, Z may be about 3.5 inches from the light beam 111. Arranging the three shared locations X, Y, Z as close to the light beam 111 as possible may improve measurement accuracy.

The plurality of interferometers 140 may comprise more than three pairs of interferometers. Increasing the number of pairs of interferometers may improve accuracy of measurements and simplify calculations. For example, the plurality of interferometers may comprise four interferometers disposed on the imaging device 110 and four interferometers disposed on the stage 120. Accordingly, the beams from the four pairs of interferometers may be aligned on opposite sides of the horizontal glass plate 131 at four shared locations. The four shared locations may be any four non-collinear points on the horizontal glass plate. For example, the four shared locations may be in a rectangular arrangement. The four shared locations may surround the light beam 111 or may be arranged on one side of the light beam 111. The four shared locations may surround the aperture 134. According to an embodiment of the present disclosure, the four shared locations may be farther away from the light beam 111 than the edge of the target reticle 112. For example, the target reticle may be about 6 inches square, and each of the four shared locations may be about 3.5 inches from the light beam 111.

Figure 3:
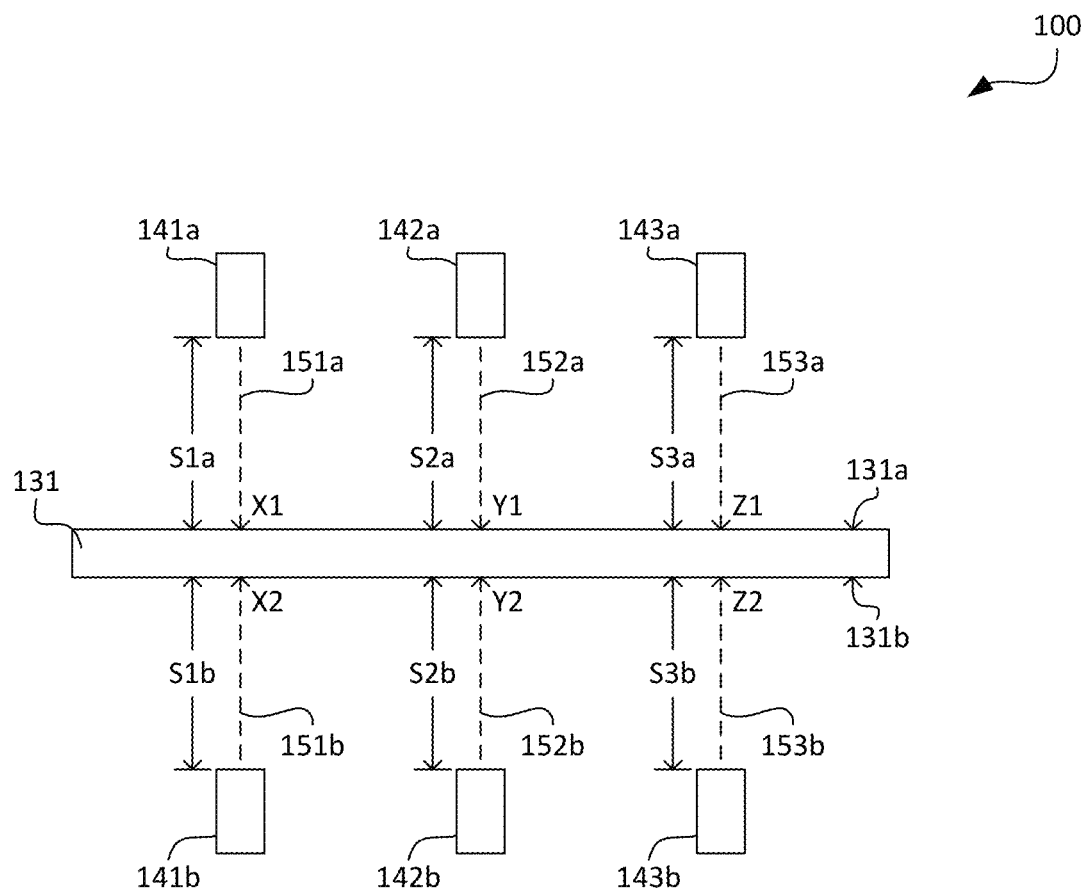
FIG. 3 is a block diagram showing the measurements from an apparatus of an embodiment of the present disclosure.

The processor 150 may be configured to measure distances S1a, S2a, S3a between the imaging device 110 and the isolation plate 130. For example, as shown in FIG. 3, the processor 150 may be configured to measure a first distance S1a between the first interferometer 141a and the first location X1 based on the first beam 151a of the first beam set reflected off the first side 131a of the horizontal glass plate 131; a second distance S2a between the second interferometer 142a and the second location Y1 based on the second beam 152a of the first beam set reflected off the first side 131a of the horizontal glass plate 131; and a third distance S3a between the third interferometer 143a and the third location Z1 based on the third beam 153a of the first beam set reflected off the first side 131a of the horizontal glass plate 131. The first beam set 151a, 152a, 153a may be uninterrupted between the respective interferometers 141a, 142a, 143a and the first side 131a of the horizontal glass plate 131.

The processor 150 may further be configured to measure distances S1b, S2b, S3b between the stage 120 and the isolation plate 130. For example, as shown in FIG. 3, the processor 150 may be configured to measure a first distance S1b between the first interferometer 141b and the first location X2 based on the first beam 151b of the second beam set reflected off the second side 131b of the horizontal glass plate 131; a second distance S2b between the second interferometer 142b and the second location Y2 based on the second beam 152b of the second beam set reflected off the second side 131b of the horizontal glass plate 131; and a third distance S3b between the third interferometer 143b and the third location Z2 based on the third beam 153b of the second beam set reflected off the second side 131b of the horizontal glass plate 131. The second beam set 151b, 152b, 153b may be uninterrupted between the respective interferometers 141b, 142b, 143b and the second side 131b of the horizontal glass plate 131.

According to an embodiment of the present disclosure, the processor 150 may further be configured to determine sums S1, S2, S3 of the distances S1a, S2a, S3a between the imaging device 110 and the isolation plate 130 and the distances S1b, S2b, S3b between the stage 120 and the isolation plate 130 at each of the three locations on the horizontal glass plate 131. For example, a first sum S1 may be the sum of the first distance Sla and the first distance S1b; a second sum S2 may be the sum of the second distance S2a and the second distance S2b; and a third sum S3 may be the sum of the third distance S3a and the third distance S3b. The processor 150 may compare the sums S1, S2, S3 to preset sums P1, P2, P3 to determine relative movement between the imaging device 110 and the stage 120 between $t_1$ and $t_2$, where $t_2$ is present time and $t_1$ is a time before $t_2$.

The relative movement may correspond to movement in one of six degrees of freedom, comprising: surge (forward/backward movement along the Y-direction), heave (up/down movement along the Z-direction), sway (left/right movement along the X-direction), roll (rotation about the Y-axis), pitch (rotation about the X-axis), and yaw (rotation about the Z-axis). For example, the sums S1, S2, S3 may be used to determine heave, pitch, and roll.

According to an embodiment of the present disclosure, the preset sums P1, P2, P3 may correspond to sums S1, S2, S3 of the distances S1a, S2a, S3a between the imaging device 110 and the isolation plate 130 and the distances S1b, S2b, S3b between the stage 120 and the isolation plate 130 measured at $t_1$. In this way, the relative movement determined by the processor 150 may be based on changes in the measurements of the sums S1, S2, S3 between $t_1$ and $t_2$. The frequency of measurements may be in the MHz range. This may allow mechanical frequency issues (typically <200 Hz) to be isolated from measurement issues. It may also allow measurements to be averaged to reduce noise.

Figure 4:
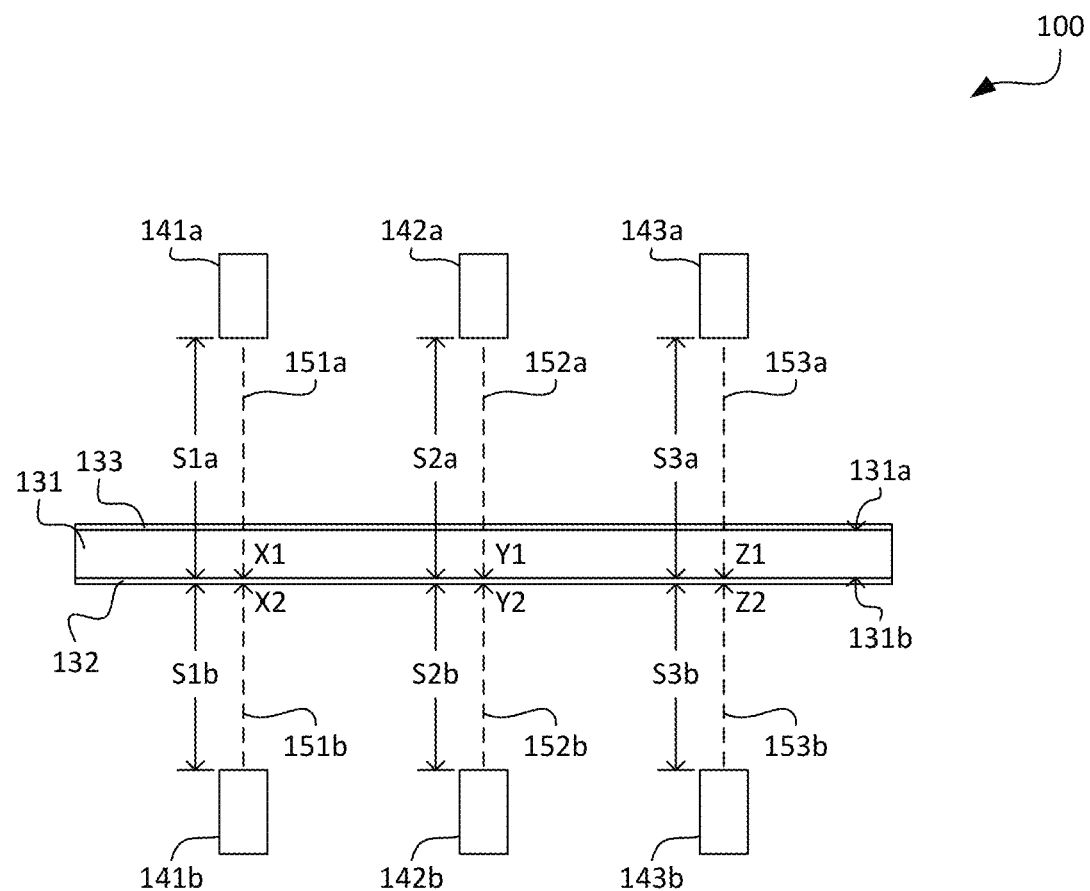
FIG. 4 is a block diagram showing measurements from an apparatus according to another embodiment of the present disclosure.

According to an embodiment of the present disclosure, as shown in FIG. 4, a reflective coating layer 132 may be provided on one side of the horizontal glass plate 131. For example, the reflective coating layer 132 may be provided on the second side 131b of the horizontal glass plate 131. The reflective coating layer may be metal (such as aluminum or silver) covered with a protective layer (such as magnesium fluoride or similar). The first beam set 151a, 152a, 153a and the second beam set 151b, 152b, 153b may reflect off the reflective coating layer 132. An anti-reflective coating layer 133 may be provided on one side of the horizontal glass plate. For example, the anti-reflective coating layer 133 may be provided on the first side 131a of the horizontal glass plate 131. The anti-reflective coating layer 133 may be comprised of chemicals with a refractive index between that of vacuum (1.0) and the type of glass used in the horizontal glass plate 131 (e.g., 1.46 for fused silica). For example, the anti-reflective coating layer 133 may be comprised of magnesium fluoride, which has a refractive index of 1.38 and reduces the reflectance at the non-reflective surface from ~4% each way to less than 2% each way. One set of the first beam set 151a, 152a, 153a and the second beam set 151b, 152b, 153b may pass through the anti-reflective coating layer 133. In this way, any effect of changes to the thickness of the horizontal glass plate 131 may be minimized when determining the sums S1, S2, S3, as only the thickness of the reflective coating layer 132 lies between the first beam set 151a, 152a, 153a and the second beam set 151b, 152b, 153b.

Apparatus 100 may provide advantages for inspection processes. For example, the imaging device 110 and the stage 120 do not need to hold large mirrors, which reduces the weight of these moving components and allows the interferometers to be placed at more convenient locations on the imaging device 110 and the stage 120. Instead, a single horizontal glass plate 131 is provided on the stationary isolation plate 130. Any drift or movement of the horizontal glass plate 131 due to system vibration is common between measurements from the imaging device 110 and the stage 120, so it does not introduce error to the system. Horizontal mirrors may offer improved signal-to-noise ratio for interferometers compared to 45-degree mirrors, which may be subject to misalignment. In addition, the beam path lengths of the first set of beams 151a, 152a, 153a, and the second set of beams 151b, 152b, 153b are relatively short compared to prior art systems, which reduces the susceptibility to wavelength instability.

Figure 2C:
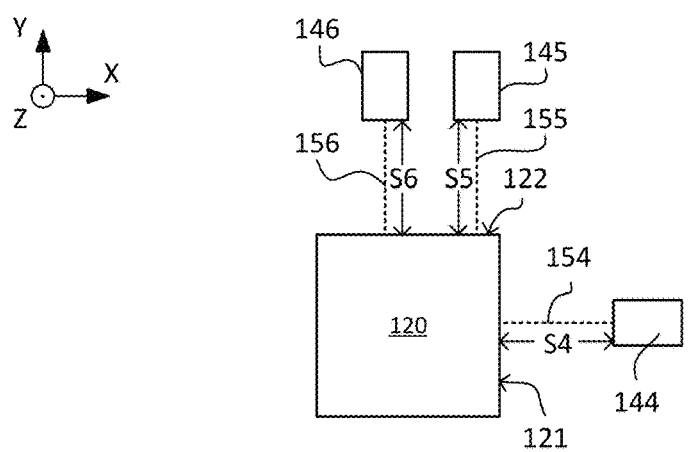
FIG. 2C illustrates a top-down view of a stage and corresponding measurements from an apparatus according to an embodiment of the present disclosure.

As shown in FIGS. 1 and 2C, the plurality of interferometers 140 may further comprise an X interferometer 144, a Y interferometer 145, and an Rz interferometer 146. The X interferometer 144, the Y interferometer 145, and the Rz interferometer 146 may be arranged inside vacuum region 102 adjacent to the stage 120 or outside of the isolation plate 130. The X interferometer 144, the Y interferometer 145, and the Rz interferometer 146 held by a support structure 114 connected to the imaging device 110. The X interferometer 144 may be configured to direct an X beam 154 in the X-direction toward a first side 121 of the stage 120. The Y interferometer 145 may be configured to direct a Y beam 155 in the Y-direction toward a second side 122 of the stage 120. The Rz interferometer 146 may be configured to direct an Rz beam 156 in the Y-direction toward the second side 122 of the stage 120. The Rz interferometer 146 may be positioned a fixed distance from the Y interferometer 145, e.g., 50 mm. The first side 121 and second side 122 of the stage 120 may be mirrors, such that the X beam 154, Y beam 155, and Rz beam 156 may reflect off of the stage 120.

The processor 150 may be further configured to measure: a fourth distance S4 between the X interferometer 144 and the stage 120 based on the X beam 154 reflected off of the first side 121 of the stage 120; a fifth distance S5 between the Y interferometer 145 and the stage 120 based on the Y beam 155 reflected off of the second side 122 of the stage 120; and a sixth distance S6 between the Rz interferometer 146 and the stage 120 based on the Rz beam reflected off of the second side 122 of the stage 120. The processor 150 may compare the distances S4, S5, S6 to preset distances P4, P5, P6 to determine relative movement of the stage 120. For example, the fourth distance S4 may be used to determine sway (left/right movement along the X-direction); the fifth distance S5 may be used to determine surge (forward/backward movement along the Y-direction); and the fifth distance S5 and the sixth distance S6 may be used to determine yaw (rotation about the Z-axis). In this way, the apparatus 100 may be configured to determine relative movement in all six degrees of freedom using the plurality of interferometers 140.

According to an embodiment of the present disclosure, the preset distances P4, P5, P6 may correspond to distances S4, S5, S6 measured at $t_1$. In this way, the relative movement determined by the processor 150 may be based on changes in the measurements of the distances S4, S5, S6 between $t_1$ and $t_2$. The frequency of measurements may be in the MHz range.

With the apparatus 100, there may be no need for a metrology frame that extends in the horizontal direction around the stage travel area. Such a frame may be hard to design in terms of: (a) eigen frequencies (>=300 Hz); (b) in combination with a large wing span (0.8 m); (c) tight requirements on thermal expansion (<<1 nm over 15 minutes): and (d) the very strict contamination requirements in the space above/around the stage 120. In the space where the fibers are routed to the stage 120, a less strict (in the order of 100 times) vacuum regime can be applied, (e) making a stiff connection between the metrology frame and the optics frame while passing in some way through the isolation plate 130 and still making both frames independently serviceable.

While no metrology frame is necessary using the apparatus 100, it is contemplated that an embodiment of the present disclosure may include a metrology frame. In such embodiments, additional interferometers may be provided, directed at the imaging device 110 and the stage 120, and configured similarly to the interferometers 140 described above to measure distances and determine relative movement of the metrology frame using the processor 150.

Figure 5:
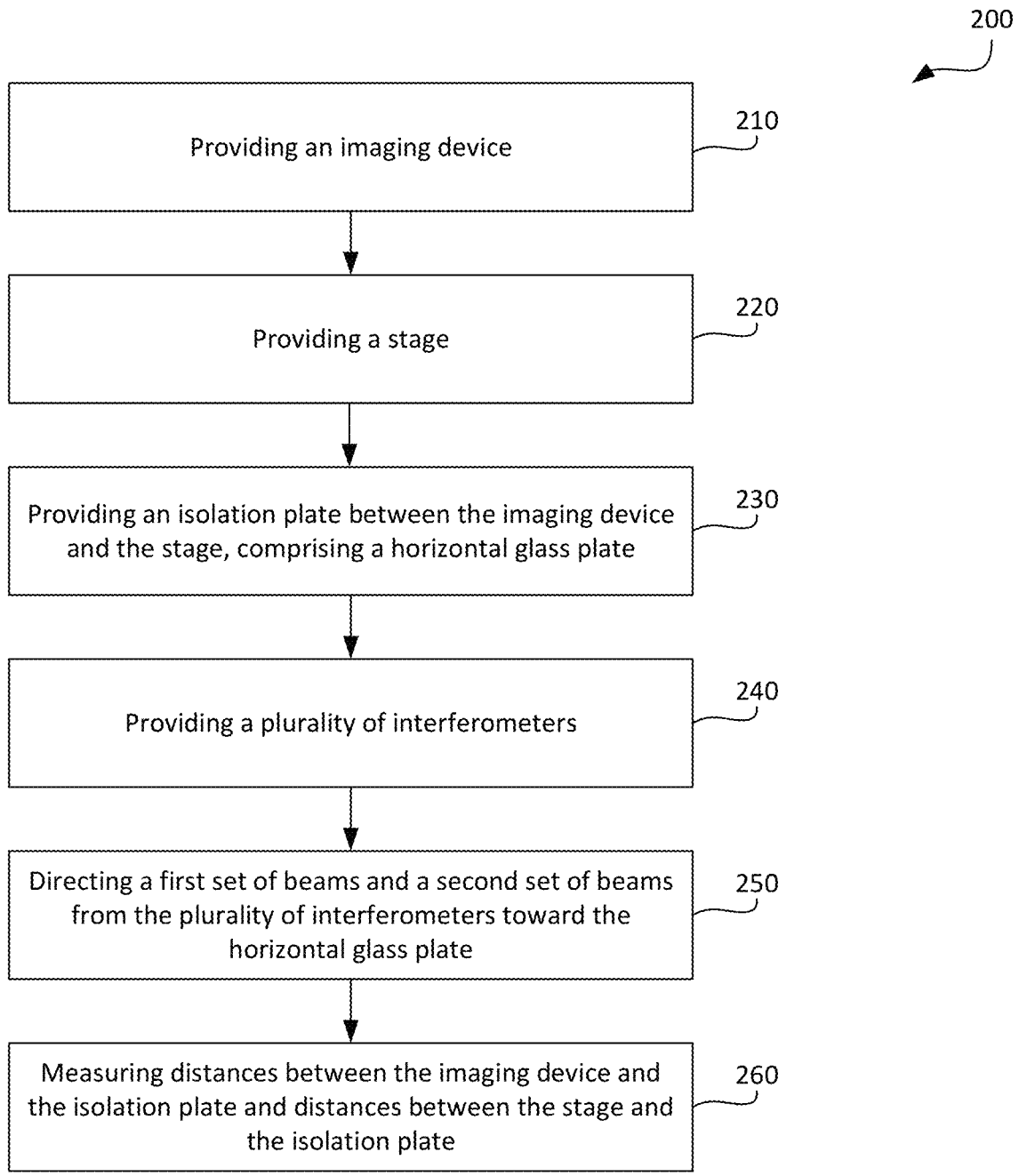
FIG. 5 is a flow chart of a method according to an embodiment of the present disclosure.

An embodiment of the present disclosure provides a method 200. As shown in FIG. 5, the method 200 may comprise the following steps.

At step 210, an imaging device may be provided. The imaging device may be configured to receive a light beam from a target reticle. The light beam may be configured to perform inspection of the target reticle. The target reticle may be a wafer, a workpiece, or any other object to be inspected by the imaging device. The imaging device may be disposed on a passive vibration isolator. The passive vibration isolator 113 may be comprised of a spring/damper system configured to absorb movement in horizontal and vertical directions. For example, the passive vibration isolator 113 may include elastomers enclosed in vacuum bellows.

At step 220, a stage may be provided. The stage may be movable relative to the imaging device. For example, the stage may move relative to the imaging device to perform various inspection processes on the target reticle, e.g. swathing, step-and-settle, hotspot, etc. The stage may be configured to hold the target reticle.

At step 230, an isolation plate may be provided between the imaging device and the stage. The isolation plate may separate the imaging device and the stage into separate vacuum regions. The isolation plate may comprise a horizontal glass plate.

At step 240, a plurality of interferometers may be provided. The plurality of interferometers may be fiber-optic-based interferometers. The plurality of interferometers may be in electronic communication with a processor.

The plurality of interferometers may comprise three interferometers disposed on the imaging device. These three interferometers may be configured to direct a first beam set in a first direction D1 toward three locations X1, Y1, Z1, on a first side of the horizontal glass plate. For example, a first interferometer may be configured to direct a first beam of the first beam set toward a first location X1 on the horizontal glass plate; a second interferometer may be configured to direct a second beam of the first beam set toward a second location Y1 on the horizontal glass plate; and a third interferometer may be configured to direct a third beam of the first beam set toward a third location Z1 on the horizontal glass plate.

The plurality of interferometers may further comprise three interferometers disposed on the stage. These three interferometers may be configured to direct a second beam set in a second direction D2 toward three locations X2, Y2, Z2 on a second side of the horizontal glass plate. For example, a first interferometer may be configured to direct a first beam of the second beam set toward a first location X2 on the horizontal glass plate; a second interferometer may be configured to direct a second beam of the second beam set toward a second location Y2 on the horizontal glass plate; and a third interferometer may be configured to direct a third beam of the second beam set toward a third location Z2 on the horizontal glass plate. The second direction D2 may be opposite to the first direction D1. For example, the first direction D1 may be down, and the second direction D2 may be up.

The three locations X1, Y1, Z1 on the first side of the horizontal glass plate may be aligned with the three locations X2, Y2, Z2 on the second side of the horizontal glass plate. In this way, the first beam set may be aligned with the second beam set on opposite sides of the horizontal glass plate, and relative to three shared locations X, Y, Z. The three shared locations X, Y, Z may be any three non-collinear points on the horizontal glass plate. For example, the three shared locations X, Y, Z may be in a triangular arrangement. The three shared locations X, Y, Z may surround the light beam 111 or may be arranged on one side of the light beam 111. The three shared locations X, Y, Z, may surround the aperture 134. According to an embodiment of the present disclosure, the three shared locations X, Y, Z may be farther away from light beam 111 than the edge of the target reticle 112. For example, the target reticle may be about 6 inches square, and each of the three shared locations X, Y, Z may be about 3.5 inches from the light beam 111. Arranging the three shared locations X, Y, Z as close to the light beam 111 as possible may improve measurement accuracy.

At step 250, the first set of beams and the second set of beams may be directed toward the horizontal glass plate. For example, the first set of beams may be directed toward the first side of the horizontal glass plate at locations X1, Y1, Z1, and the second set of beams may be directed toward the second side of the horizontal glass plate at locations X2, Y2, Z2.

At step 260, the processor may measure distances S1$a$, S2$a$, S3$a$ between the imaging device and the isolation plate and distances S1$b$, S2$b$, S3$b$ between the stage and the isolation plate based on the beams reflected from the horizontal glass plate. For example, the processor may be configured to measure a first distance S1a between the first interferometer and the first location X1 based on the first beam of the first beam set reflected off the first side of the horizontal glass plate; a second distance S2$a$ between the second interferometer and the second location Y1 based on the second beam of the first beam set reflected off the first side of the horizontal glass plate; and a third distance S3$a$ between the third interferometer and the third location Z1 based on the third beam of the first beam set reflected off the first side of the horizontal glass plate. The processor 150 may also be configured to measure a first distance S 1b between the first interferometer and the first location X2 based on the first beam of the second beam set reflected off the second side of the horizontal glass plate; a second distance S2$b$ between the second interferometer and the second location Y2 based on the second beam of the second beam set reflected off the second side of the horizontal glass plate; and a third distance S3$b$ between the third interferometer and the third location Z2 based on the third beam of the second beam set reflected off the second side of the horizontal glass plate. The first beam set and the second beam set may be uninterrupted between the respective interferometers and the horizontal glass plate.

Figure 6:
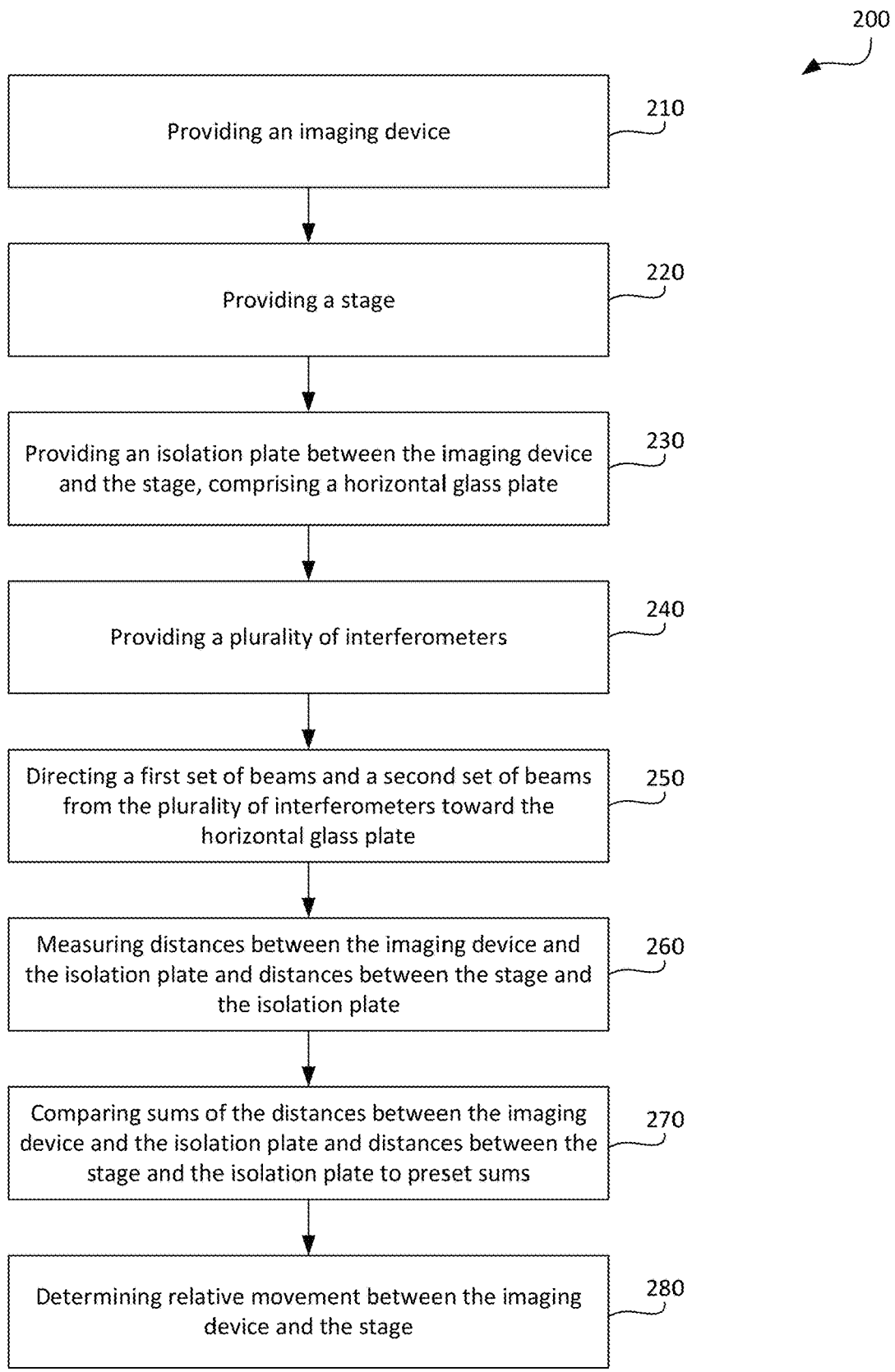
FIG. 6 is a flow chart of a method according to another embodiment of the present disclosure.

According to an embodiment of the present disclosure, shown in FIG. 6, the method 200 may further comprise the following steps.

At step 270, the processor may compare sums S1, S2, S3 of the distances S1a, S2a, S3a between the imaging device and the isolation plate and the distances S1b, S2b, S3b between the stage and the isolation plate to preset sums P1, P2, P3. For example, a first sum S1 may be the sum of the first distance S1a and the first distance S1b; a second sum S2 may be the sum of the second distance S2a and the second distance S2b; and a third sum S3 may be the sum of the third distance S3a and the third distance S3b.

At step 280, the processor may determine relative movement between the imaging device and the stage between $t_1$ and $t_2$, where $t_2$ is present time and $t_1$ is a time before $t_2$. The relative movement may correspond to movement in one of six degrees of freedom, comprising: surge (forward/backward movement along the Y-direction), heave (up/down movement along the Z-direction), sway (left/right movement along the X-direction), roll (rotation about the y-axis), pitch (rotation about the X-axis), and yaw (rotation about the Z-axis). For example, the sums S1, S2, S3 may be used to determine heave, pitch, and roll.

According to an embodiment of the present disclosure, the plurality of interferometers may further comprise an X interferometer, a Y interferometer, and an Rz interferometer. The X interferometer, the Y interferometer, and the Rz interferometer may be arranged inside vacuum region adjacent to the stage or outside of the isolation plate. The X interferometer may be configured to direct an X beam in the X-direction toward a first side of the stage. The Y interferometer may be configured to direct a Y beam in the Y-direction toward a second side of the stage. The Rz interferometer may be configured to direct an Rz beam in the Y-direction toward the second side of the stage. The Rz interferometer may be positioned a fixed distance from the Y interferometer, e.g., 50 mm. The first side and second side of the stage may be mirrors, such that the X beam, Y beam, and Rz beam may reflect off of the stage. Accordingly, step 250 may further comprise directing the X beam, Y beam, and Rz beam toward the stage.

The processor may be further configured to measure: a fourth distance S4 between the X interferometer and the stage based on the X beam reflected off of the first side of the stage; a fifth distance S5 between the Y interferometer and the stage based on the Y beam reflected off of the second side of the stage; and a sixth distance S6 between the Rz interferometer and the stage based on the Rz beam reflected off of the second side of the stage. The processor may compare the distances S4, S5, S6 to preset distances P4, P5, P6 to determine relative movement of the stage 120. Accordingly, step 260 may further comprise measuring distances S4, S5, S6.

The fourth distance S4 may be used to determine sway (left/right movement along the X-direction); the fifth distance S5 may be used to determine surge (forward/backward movement along the Y-direction); and the fifth distance S5 and the sixth distance S6 may be used to determine yaw (rotation about the Z-axis). Accordingly, step 280 may comprise determining relative movement in all six degrees of freedom using the plurality of interferometers.

According to an embodiment of the present disclosure, the preset sums P1, P2, P3 may correspond to sums S1, S2, S3 of the distances S1a, S2a, S3a between the imaging device and the isolation plate and the distances S1b, S2b, S3b between the stage and the isolation plate measured at $t_1$. In this way, the relative movement determined by the processor may be based on changes in the measurements of the sums S1, S2, S3 between $t_1$ and $t_2$. The frequency of measurements may be in the MHz range.

According to an embodiment of the present disclosure, a reflective coating layer may be provided on one side of the horizontal glass plate. The first beam set and the second beam set may reflect off the reflective coating layer. An anti-reflective coating layer may be provided on the other side of the horizontal glass plate. One set of the first beam set and the second beam set may pass through the anti-reflective coating layer. In this way, any effect of changes to the thickness of the horizontal glass plate may be minimized when determining the sums S1, S2, S3.

Method 200 may provide advantages for inspection processes. For example, the imaging device and the stage do not need to hold large mirrors, which reduces the weight of these moving components and allows the interferometers to be placed at more convenient locations on the imaging device and the stage. Instead, a single horizontal glass plate is provided on the stationary isolation plate. Any drift or movement of the horizontal glass plate due to system vibration is common between measurements from the imaging device and the stage, so it does not introduce error to the system. Horizontal mirrors may offer improved signal-to-noise ratio for interferometers compared to 45-degree mirrors, which may be subject to misalignment. In addition, the beam path lengths of the first set of beams and the second set of beams are relatively short compared to prior art systems, which reduces the susceptibility to wavelength instability.

An embodiment of the present disclosure may provide a non-transitory computer-readable storage medium configured to perform steps 260-280 of the method 200.

While disclosed with respect to an optical system, aspects of the embodiments disclosed herein also can be used with electron beam systems.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. An apparatus comprising:
   an imaging device configured to receive a light beam from a target reticle;
   a stage movable relative to the imaging device, the stage being configured to hold the target reticle;
   an isolation plate provided between the imaging device and the stage, the isolation plate comprising a horizontal glass plate; and
   a plurality of interferometers in electronic communication with a processor, the plurality of interferometers comprising:
   three interferometers disposed on the imaging device, configured to direct a first beam set in a first direction toward three locations on the horizontal glass plate; and
   three interferometers disposed on the stage, configured to direct a second beam set in a second direction toward the three locations on the horizontal glass plate, the second direction being opposite to the first direction;
   wherein the processor is configured to measure distances between the imaging device and the isolation plate and distances between the stage and the isolation plate at each of the three locations on the horizontal glass plate based on the first beam set and the second beam set reflected from the horizontal glass plate.

2. The apparatus of claim 1, wherein the first direction is down, and the second direction is up.

3. The apparatus of claim 1, wherein a reflective coating layer is provided on a first side of the horizontal glass plate, such that the first beam set and the second beam set reflect off the reflective coating layer.

4. The apparatus of claim 3, wherein an anti-reflective coating layer is provided on a second side of the horizontal glass plate, the second side being opposite to the first side, such that one set of the first beam set and the second beam set passes through the anti-reflective coating layer.

5. The apparatus of claim 1, wherein the imaging device and the stage are provided in separate vacuum regions, separated by the isolation plate.

6. The apparatus of claim 1, wherein the imaging device is disposed on a passive vibration isolator.

7. The apparatus of claim 1, wherein the first beam set and the second beam set are uninterrupted between each interferometer and the horizontal glass plate.

8. The apparatus of claim 1, wherein sums of the distances between the imaging device and the isolation plate and the distances between the stage and the isolation plate at each of the three locations are compared to preset sums to determine relative movement between the imaging device and the stage between $t_1$ and $t_2$, wherein $t_2$ is present time and $t_1$ is a time before $t_2$.

9. The apparatus of claim 8, wherein the relative movement corresponds to movement in one of six degrees of freedom, comprising: surge, heave, sway, roll, pitch, and yaw.

10. The apparatus of claim 8, wherein the preset sums correspond to sums of the distances between the imaging device and the isolation plate and the distances between the stage and the isolation plate at each of the three locations measured at $t_1$.

11. A method comprising:
providing an imaging device configured to receive a light beam from a target reticle;
providing a stage movable relative to the imaging device, the stage being configured to hold the target reticle;
providing an isolation plate between the imaging device and the stage, the isolation plate comprising a horizontal glass plate;
providing a plurality of interferometers in electronic communication with a processor, the plurality of interferometers comprising:
three interferometers disposed on the imaging device, configured to direct a first beam set in a first direction toward three locations on the horizontal glass plate; and
three interferometers disposed on the stage, configured to direct a second beam set in a second direction toward the three locations on horizontal glass plate, the second direction being opposite to the first direction;
directing the first beam set and the second beam set toward the horizontal glass plate; and
measuring, using the processor, distances between the imaging device and the isolation plate and distances between the stage and the isolation plate at each of the three locations on the horizontal glass plate based on the beams reflected from the horizontal glass plate.

12. The method of claim 11, wherein a reflective coating layer is provided on a first side of the horizontal glass plate, such that the first beam set and the second beam set reflect off the reflective coating layer.

13. The method of claim 12, wherein an anti-reflective coating layer is provided on a second side of the horizontal glass plate, the second side being opposite to the first side, such that one set of the first beam set and the second beam set passes through the anti-reflective coating layer.

14. The method of claim 11, wherein the imaging device and the stage are provided in separate vacuum regions, separated by the isolation plate.

15. The method of claim 11, wherein the imaging device is disposed on a passive vibration isolator.

16. The method of claim 11, wherein the first beam set and the second beam set are uninterrupted between each interferometer and the horizontal glass plate.

17. The method of claim 11, further comprising:
comparing, using the processor, sums of the distances between the imaging device and the isolation plate and the distances between the stage and the isolation plate at each of the three locations to preset sums; and
determining, using the processor, relative movement between the imaging device and the stage between $t_1$ and $t_2$, wherein $t_2$ is present time and $t_1$ is a time before $t_2$.

18. The method of claim 17, wherein the relative movement corresponds to movement in one of six degrees of freedom, comprising: surge, heave, sway, roll, pitch, and yaw.

19. The method of claim 17, wherein the preset sums correspond to sums of the distances between the imaging device and the isolation plate and the distances between the stage and the isolation plate at each of the three locations measured at $t_1$.

20. A non-transitory computer-readable storage medium configured to perform the measuring step of claim 11.

* * * * *